(12) United States Patent
Hoya et al.

(10) Patent No.: US 7,765,455 B2
(45) Date of Patent: Jul. 27, 2010

(54) SEMICONDUCTOR MEMORY DEVICE

(75) Inventors: Katsuhiko Hoya, Yokohama (JP); Shinichiro Shiratake, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 1024 days.

(21) Appl. No.: 11/397,572

(22) Filed: Apr. 5, 2006

(65) Prior Publication Data
US 2007/0079226 A1 Apr. 5, 2007

(30) Foreign Application Priority Data
Sep. 13, 2005 (JP) ............................. 2005-265342

(51) Int. Cl.
*G11C 29/00* (2006.01)
(52) U.S. Cl. .................. 714/763; 714/702; 714/766; 714/E11.116; 714/758; 714/800; 714/801; 714/E11.057; 714/785
(58) Field of Classification Search ................. 714/763, 714/702, 766, E11.116, 758, 800, 801, E11.057, 714/785
See application file for complete search history.

(56) References Cited

U.S. PATENT DOCUMENTS

| 4,555,784 | A | * | 11/1985 | Wood ......................... 714/785 |
| 5,140,597 | A | * | 8/1992 | Araki ......................... 714/805 |
| 5,383,205 | A | * | 1/1995 | Makihara et al. ............ 714/773 |
| 5,521,878 | A | * | 5/1996 | Ohtani et al. ............ 365/233.1 |
| 5,774,481 | A | * | 6/1998 | Meaney et al. ............... 714/763 |
| 5,903,492 | A | * | 5/1999 | Takashima ................... 365/145 |
| 5,930,273 | A | * | 7/1999 | Mukojima ................... 714/776 |
| 6,973,613 | B2 | * | 12/2005 | Cypher ....................... 714/773 |
| 7,366,971 | B2 | * | 4/2008 | Kikutake et al. ............ 714/801 |
| 2003/0106010 | A1 | * | 6/2003 | Fujioka et al. .............. 714/763 |
| 2007/0079226 | A1 | | 4/2007 | Hoya et al. |

FOREIGN PATENT DOCUMENTS

| JP | 11-16389 | 1/1999 |
| JP | 2004-213719 | 7/2004 |

OTHER PUBLICATIONS

U.S. Appl. No. 11/668,706, filed Jan. 30, 2007, Hoya et al.
U.S. Appl. No. 12/406,397, filed Mar. 18, 2009, Shirai.

* cited by examiner

*Primary Examiner*—Scott T Baderman
*Assistant Examiner*—Enam Ahmed
(74) *Attorney, Agent, or Firm*—Oblon, Spivak, McClelland, Maier & Neustadt, L.L.P.

(57) ABSTRACT

A semiconductor memory device includes a parity generation circuit which generates a parity bit corresponding to a first number of data bits, a memory cell array including memory cells, and having first and second areas, the first area storing data, the second area storing the parity bit, a syndrome generation circuit which generates a syndrome bit for correcting an error in read data which are read from the first area, has the first number of data bits and corresponds to the parity bit read from the second area, based on the parity bit and the read data, and a parity correction circuit which corrects the parity bit generated by the parity generation circuit. The parity generation circuit generates the parity bit for data which includes input data and a part of the read data.

18 Claims, 6 Drawing Sheets

SEMICONDUCTOR MEMORY DEVICE

CROSS-REFERENCE TO RELATED APPLICATIONS

This application is based upon and claims the benefit of priority from prior Japanese Patent Application No. 2005-265342, filed Sep. 13, 2005, the entire contents of which are incorporated herein by reference.

BACKGROUND OF THE INVENTION

1. Field of the Invention

The present invention relates to a semiconductor memory device, and more particularly to a semiconductor memory device with an error correction function.

2. Description of the Related Art

Semiconductor memory devices with error checking and correcting (ECC) circuits are known. The ECC circuit has a function for checking whether data bits read from a memory cell array include error data, and correcting error data, if there is any. When a semiconductor memory device has the ECC circuit, it is highly reliable.

To correct error data, the ECC circuit uses, for example, parity bits. The parity bits are stored in the memory cell array of the memory device, independently of data. Based on computation using both the parity bits and data, the ECC circuit detects and corrects error data contained in the data.

The larger the number of data bits corresponding to one parity bit, the less the number of the required parity bits. Accordingly, a greater number of data bits than those input to or output from the memory are read therefrom, and the read data bits are checked and corrected by the ECC circuit. Part of the corrected data bits are output.

Specifically, during data reading, syndrome bits are generated from the parity bits and read data. Using the syndrome bits, it is checked whether the read data contains an error. If there is an error, the data is corrected, and part of the corrected data is output.

In contrast, during data writing, reading is performed before data is written. When the number of data bits corresponding to parity bits is greater than that of input data bits, part of data bits read from the memory are added to the input data bits, and parity bits are generated for the thus-obtained data bits (write data bits). Part of the corrected read data bits, input data bits and parity bits are stored in the memory.

Since during data writing, it is necessary to regenerate parity bits after data correction, the time required for computation for ECC is longer than the time required for computation during data reading. The computation for ECC during writing inevitably lengthens the time (write cycle time) required for writing.

Jpn. Pat. Appln. KOKAI Publication No. 11-16389, for example, discloses a technique, related to the above, for enhancing the accuracy of detection of a data error.

BRIEF SUMMARY OF THE INVENTION

According to an aspect of the present invention, there is provided a semiconductor memory device comprising:

a parity generation circuit which generates a parity bit for error checking, corresponding to a first number of data bits;

a memory cell array including a plurality of memory cells, and having a first area and a second area, the first area storing data, the second area storing the parity bit;

a syndrome generation circuit which generates a syndrome bit for correcting an error in read data which are read from the first area, has the first number of data bits and corresponds to the parity bit read from the second area, based on the parity bit and the read data; and a parity correction circuit which corrects the parity bit generated by the parity generation circuit, wherein the parity generation circuit generates the parity bit for data which includes input data and a part of the read data, the input data having a second number of data bits smaller than the first number of data bits.

BRIEF DESCRIPTION OF THE SEVERAL VIEWS OF THE DRAWING

FIG. 3 is a view illustrating a hamming code for use in a parity generation circuit 17 and syndrome generation circuit 15 according to the first embodiment;

FIG. 6 is a view illustrating a check code for use in a parity generation circuit 17 and syndrome generation circuit 15 according to the second embodiment;

DETAILED DESCRIPTION OF THE INVENTION

Figure 1:
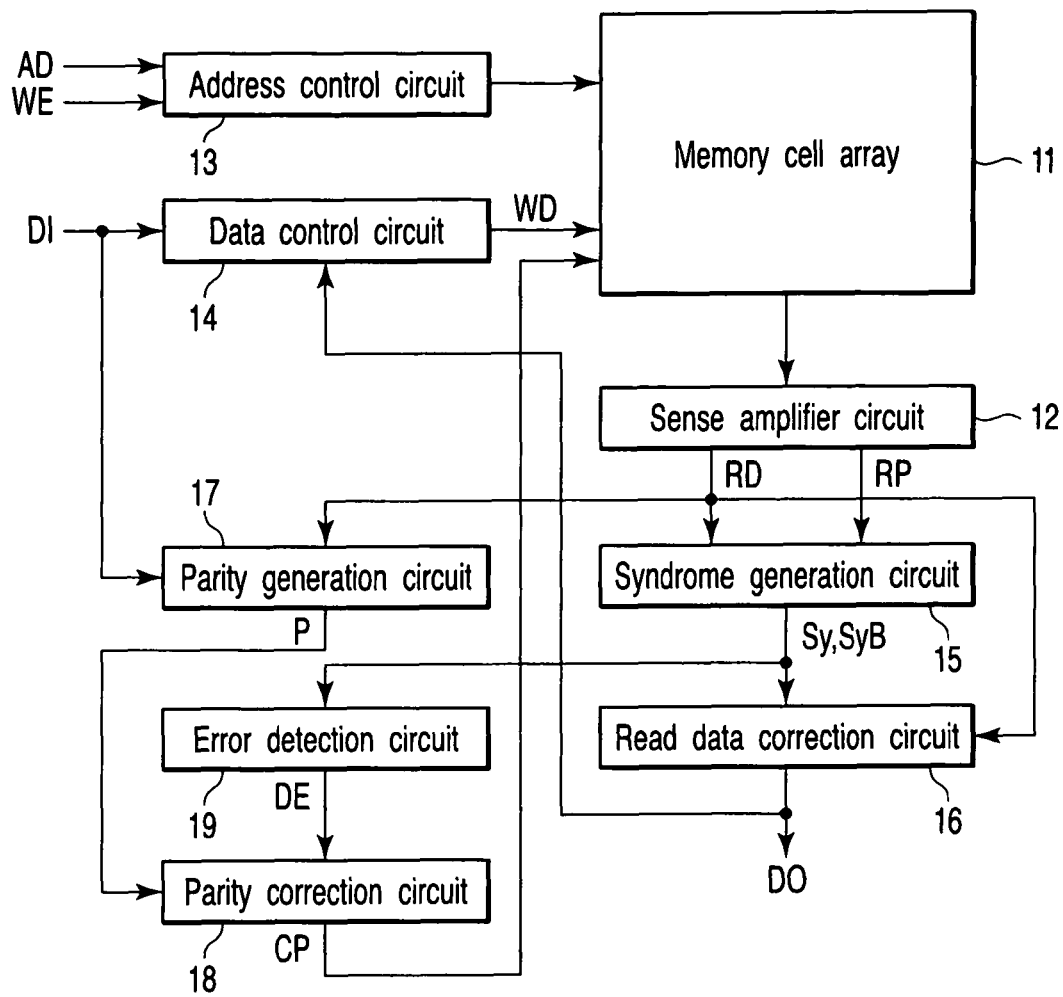
FIG. 1 is a block diagram illustrating the configuration of a semiconductor memory device according to a first embodiment of the invention.

Embodiments of the invention will be described with reference to the accompanying drawings. In the description below, elements having the same function and structure are denoted by the same reference numeral, and a duplicate explanation will be given only when necessary.

First Embodiment

FIG. 1 is a block diagram illustrating the configuration of a semiconductor memory device according to a first embodiment of the invention. As shown, the semiconductor memory device comprises a memory cell array 11, sense amplifier circuit 12, address control circuit 13 and data control circuit 14.

The memory cell array 11 comprises a plurality of memory cells MC arranged in rows and columns. On the memory cell array 11, a plurality of word lines WL and a plurality of bit lines BL and /BL arrange. The plurality of word lines WL extend in the row direction. The plurality of bit lines BL and /BL extend in the column direction.

A row decoder (not shown) is connected to the word lines WL. Each row of the memory cell array 11 is selected using the corresponding word line WL. A column decoder (not shown) is connected to the bit lines BL and /BL. Each column of the memory cell array 11 is selected using the corresponding bit lines BL and /BL.

The memory cell array 11 further comprises a first area for storing data DI supplied from, for example, an external circuit, and a second area for storing parity bits P described later. The sense amplifier circuit 12 detects data read from the first area of the memory cell array 11, and amplifies the detected data, and outputs the resultant data as read data RD. Further, the sense amplifier circuit 12 detects data read from the second area of the memory cell array 11, amplifies the detected data, and outputs the resultant data as a read parity bit RP.

Figure 2:
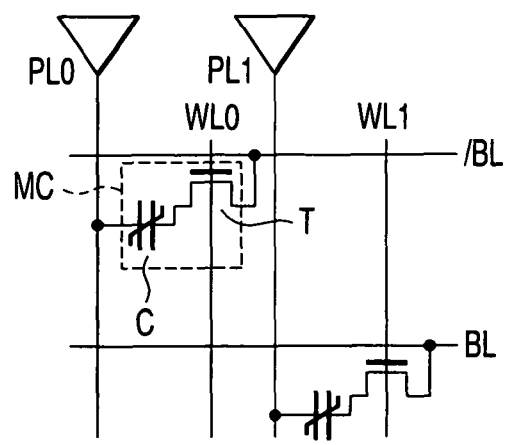
FIG. 2 is a circuit diagram illustrating an FeRAM cell as an example of a memory cell MC.

The memory cell array 11 may be formed of, for example, a dynamic random access memory (DRAM), static random access memory (SRAM) or non-volatile memory. The non-volatile memory may be FeRAM (ferroelectric random access memory), magnetic random access memory (MRAM) or flash memory. In the description below, each memory cell MC is an FeRAM cell. FIG. 2 shows the structure of the FeRAM cell.

As shown in FIG. 2, each memory cell MC is formed of a transistor T and ferroelectric capacitor C. The gate electrode of the transistor T is connected to the word line WL. The source (or drain) of the transistor T is connected to the bit line BL. The drain (or source) of the transistor T is connected to one of the electrodes of the ferroelectric capacitor C. The other electrode of the ferroelectric capacitor C is connected to a plate line PL. Namely, the transistor T and ferroelectric capacitor C are connected in series. A number of memory cells similar to the above-described memory cell MC form the memory cell array 11.

The semiconductor memory device receives, from, for example, an external circuit, address data AD, write enable signal WE, and input data bits DI0 to DI15 of, for example, 16 bits in total. The write enable signal WE enables the semiconductor memory device to read or write data therefrom and thereto. Specifically, when the write enable signal WE is at low level, data is written to the semiconductor memory device. In contrast, when the write enable signal WE is at high level, data is read from the semiconductor memory device.

The address data AD and write enable signal WE are input to the address control circuit 13. The address control circuit 13 decodes the address data AD, and supplies a row address signal and column address signal to the row decoder and column decoder of the memory cell array 11, respectively.

The input data bits DI0 to DI15 are input to the data control circuit 14. The data control circuit 14 executes control for writing, to the memory cell array 11, write data bits WD0 to WD63 of 64 bits in total acquired by adding, to the input data bits DI0 to DI15, part of the read data RD read from the memory cell array 11.

The semiconductor memory device comprises a syndrome generation circuit 15, read data correction circuit 16, parity generation circuit 17, parity correction circuit 18 and error detection circuit 19.

The parity generation circuit 17 generates, for example, parity bits P0 to P6 of 7 bits in total, using a hamming code. The parity generation circuit 17 generates the parity bits P0 to P6 in units of 64-bit data sizes.

The parity generation circuit 17 generates the parity bits P0 to P6 in units of data bits greater than 16 bits (=the total bits of the input data bits DI0 to DI15). Thus, by increasing the number of data bits (i.e., by increasing the data bit size) corresponding to each parity bit, the data size of parity bits can be reduced. This leads to the reduction of the memory capacity of the second area of the memory cell array 11 required for storing the parity bits.

The syndrome generation circuit 15 generates syndrome bits for error correction. Specifically, the syndrome generation circuit 15 generates syndrome bits Sy0 to Sy6 of 7 bits in total, using the hamming code, based on read data bits RD0 to RD63 of 64 bits in total, read from the memory cell array 11, and the parity bits P0 to P6 corresponding to the read data bits RD0 to RD63. Further, the syndrome generation circuit 15 generates inverse syndrome bits SyB0 to SyB6 that are the inverse bits of the syndrome bits Sy0 to Sy6.

Figure 3:
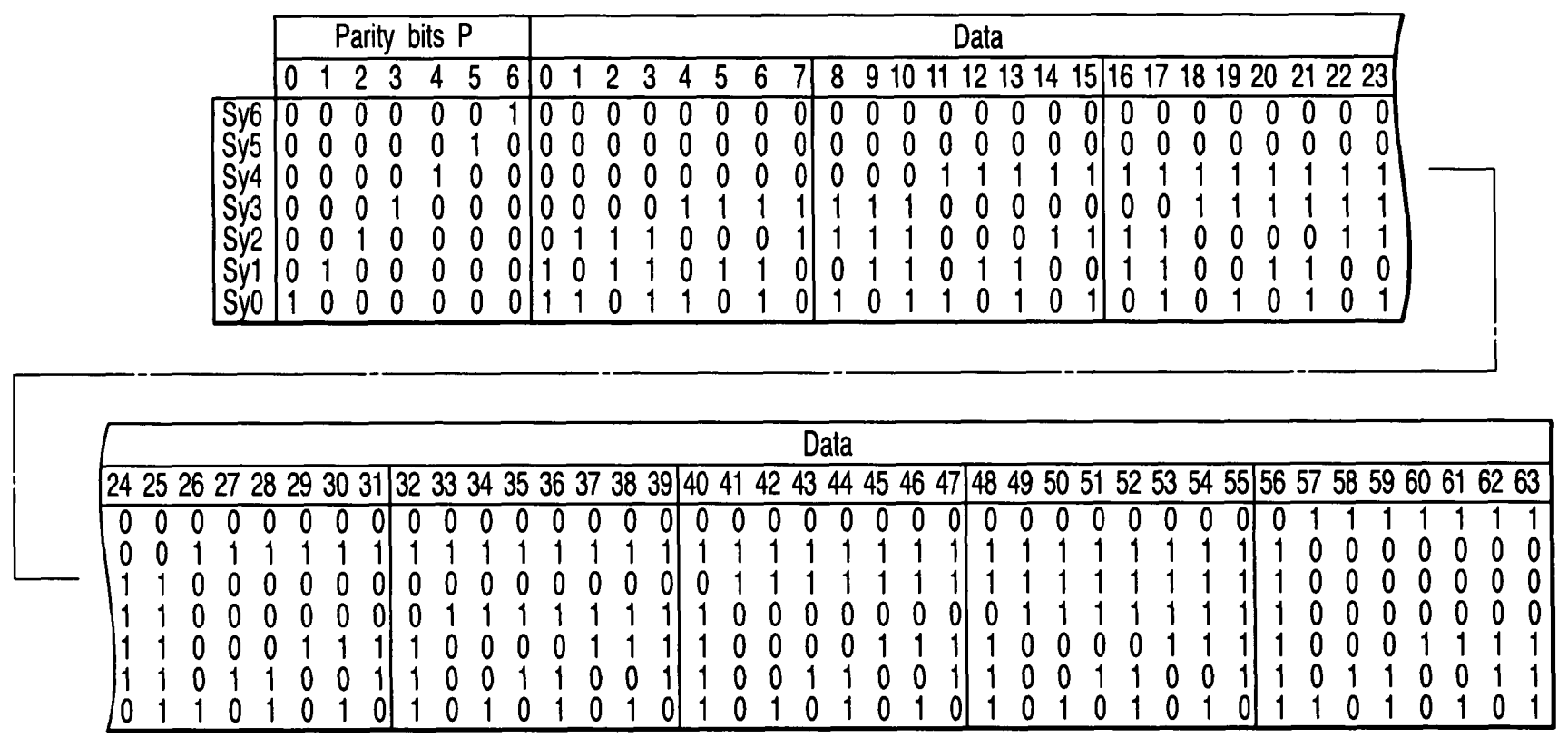

FIG. 3 shows the hamming code for use in the parity generation circuit 17 and syndrome generation circuit 15. The hamming code is formed of 7 rows corresponding in number to the syndrome bits Sy0 to Sy6, and 71 columns corresponding in number to the sum of the parity bits P0 to P6 and read data bits RD0 to RD63. Numbers 0 to 6 attached to the 7 columns of the "parity bits P" shown in FIG. 3 correspond to the bit numbers of the parity bits P0 to P6. Further, numbers 0 to 63 attached to the 64 columns of the "data" shown in FIG. 3 correspond to the bit numbers of the read data bits RD0 to RD63.

The columns corresponding to the parity bits P0 to P6 can be set to voluntary ones. Similarly, the columns corresponding to the read data bits RD0 to RD63 can be set to voluntary ones.

The error detection circuit 19 executes error detection processing on the read data bits RD0 to RD63. Specifically, the error detection circuit 19 detects whether the read data bits RD0 to RD63 contain an erroneous bit (or erroneous bits), using the syndrome bits Sy0 to Sy6 and inverse syndrome bits SyB0 to SyB6.

The parity correction circuit 18 corrects the parity bits generated by the parity generation circuit 17, based on an error detection signal DE output from the error detection circuit 19.

The read data correction circuit 16 corrects any erroneous bit if it is contained in the read data bits RD0 to RD63, based on the syndrome bits Sy0 to Sy6 generated by the syndrome generation circuit 15.

A description will now be given of the operation of the semiconductor memory device constructed as the above. The semiconductor memory device executes data writing in units of 64 data bits corresponding to the parity bits P0 to P6 of 7 bits in total. Assume here that the data and parity bits are stored beforehand in the memory cell array 11.

Firstly, the address data AD, write enable signal WE of low level and input data bits DI0 to DI15 are input from an external circuit to the semiconductor memory device. At this time, the data control circuit 14 executes processing for reading, from the second area of the memory cell array 11, the read parity bits RP0 to RP6 of 7 bits in total that correspond to the input data bits DI0 to DI15. At the same time, the data control circuit 14 executes processing for reading, from the first area of the memory cell array 11, the read data bits RD0 to RD63 of 64 bits in total that correspond to the read parity bits RP0 to RP6.

The read parity bits RP0 to RP6 read from the second area of the memory cell array 11 are input to the syndrome generation circuit 15. The read data bits RD0 to RD63 read from the first area of the memory cell array 11 are input to the syndrome generation circuit 15, read data correction circuit 16 and parity generation circuit 17.

In this state, the syndrome generation circuit 15 executes syndrome generation processing. Specifically, the syndrome generation circuit 15 generates syndrome bits Sy0 to Sy6 of 7 bits in total and inverse syndrome bits SyB0 to SyB6 of 7 bits in total, using the hamming code shown in FIG. 3. The syndrome bits Sy0 to Sy6 and inverse syndrome bits SyB0 to SyB6 are input to the read data correction circuit 16 and error detection circuit 19.

The read data correction circuit 16 corrects any erroneous bit, if it is contained in the read data bits RD0 to RD63, using the syndrome bits Sy0 to Sy6, thereby generating corrected output data bits DO0 to DO63 of 64 bits in total. The corrected output data bits DO0 to DO63 are input to the data control circuit 14.

In parallel with syndrome generation processing by the syndrome generation circuit 15, the parity generation circuit 17 executes parity generation processing. Specifically, the parity generation circuit 17 generates parity bits P0 to P6, using the hamming code, for data formed of the input data bits DI0 to DI15, and part of the read data bits RD0 to RD63 that are not subjected to error correction. The part of the read data bits mean 48-bit read data RD corresponding to the addresses other than the addresses of the input data bits DI0 to DI15. The parity bits P0 to P6 are input to the parity correction circuit 18.

The error detection circuit 19 executes error detection processing in parallel with syndrome generation processing. Specifically, the error detection circuit 19 detects whether each of the read data bits RD0 to RD63 is erroneous, using the syndrome bits Sy0 to Sy6 and inverse syndrome bits SyB0 to SyB6, and generates an error detection signal DE indicating the detection result.

A description will be given of, for example, the operation of detecting an error in data 0 (corresponding to read data RD0) included in 71-bit data that is formed of the parity bits P0 to P6 and read data bits RD0 to RD63.

Figure 4:
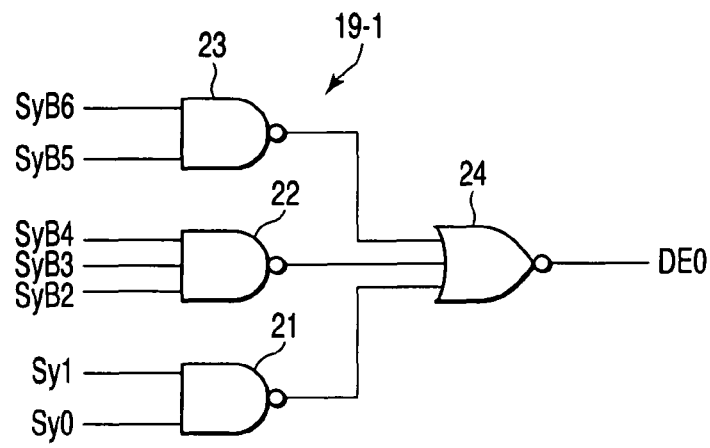
FIG. 4 is a circuit diagram illustrating part (detection circuit 19-1) of an error detection circuit 19 according to the first embodiment.

FIG. 4 is a circuit diagram illustrating a detection circuit 19-1 incorporated in the error detection circuit 19 for detecting an error in data 0. The detection circuit 19-1 comprises three NAND circuits 21 to 23 and NOR circuit 24. The NAND circuit 21 receives syndrome bits Sy0 and Sy1. The NAND circuit 22 receives inverse syndrome bits SyB2, SyB3 and SyB4. The NAND circuit 23 receives inverse syndrome bits SyB5 and SyB6.

The outputs of the NAND circuits 21 to 23 are connected to the NOR circuit 24. When an error detection signal DE0 as the output of the NOR circuit 24 indicates data "1", data 0 is determined to be erroneous. This is because the syndrome bits Sy0 to Sy6 are identical to column data included in the hamming code and corresponding to data 0. In contrast, when the error detection signal DE0 indicates data "0", data 0 is determined not to be erroneous. This error detection signal DE is input to the parity correction circuit 18.

Based on the error detection signal DE, the parity correction circuit 18 determines which one of the parity bits P0 to P6 supplied from the parity generation circuit 17 corresponds to the read data RD that contains an erroneous bit. The parity correction circuit 18 corrects the parity bit corresponding to the read data RD that contains an erroneous bit, and generates corrected parity bits CP0 to CP6 as correction results. The corrected parity bits CP0 to CP6 are stored in the second area of the memory cell array 11.

Further, the data control circuit 14 writes, to the first area of the memory cell array 11, write data bits WD0 to WD63 of 64 bits in total that are formed of the input data bits DI0 to DI15 and part of the corrected output data bits DO0 to DO63. The part of the corrected output data bits mean 48-bit corrected output data D0 corresponding to the addresses other than the addresses of the input data bits DI0 to DI15.

As described above in detail, in the first embodiment, during data write operation, syndrome generation processing (syndrome computation) and parity generation processing (parity computation) are executed in parallel, which can increase the rate of the data write operation and hence reduce the cycle time.

Further, in the first embodiment, a greater number of data bits than input data bits are assigned to each of the parity bits of a predetermined bit size in total, which can reduce the area required for storing the parity bits, and hence reduce the required memory capacity of the memory cell array.

Second Embodiment

A second embodiment is directed to an increase in the rate of error detection processing.

Figure 5:
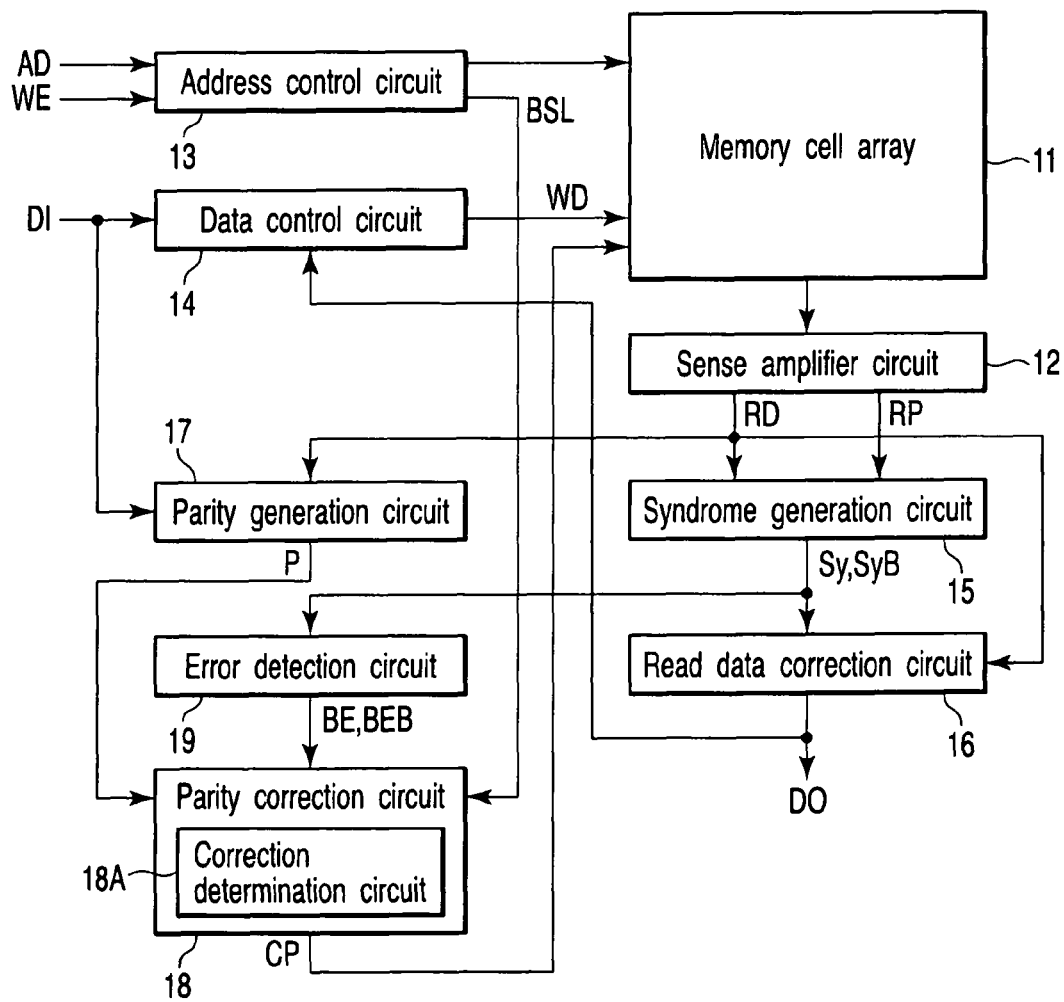
FIG. 5 is a block diagram illustrating the configuration of a semiconductor memory device according to a second embodiment of the invention.

FIG. 5 is a block diagram illustrating the configuration of a semiconductor memory device according to the second embodiment. In this embodiment, the parity generation circuit 17 and syndrome generation circuit 15 generate parity bits P0 to P7 of 8 bits in total and syndrome bits Sy0 to Sy7 of 8 bits in total, respectively, using a check code different from that of the first embodiment.

Figure 6:
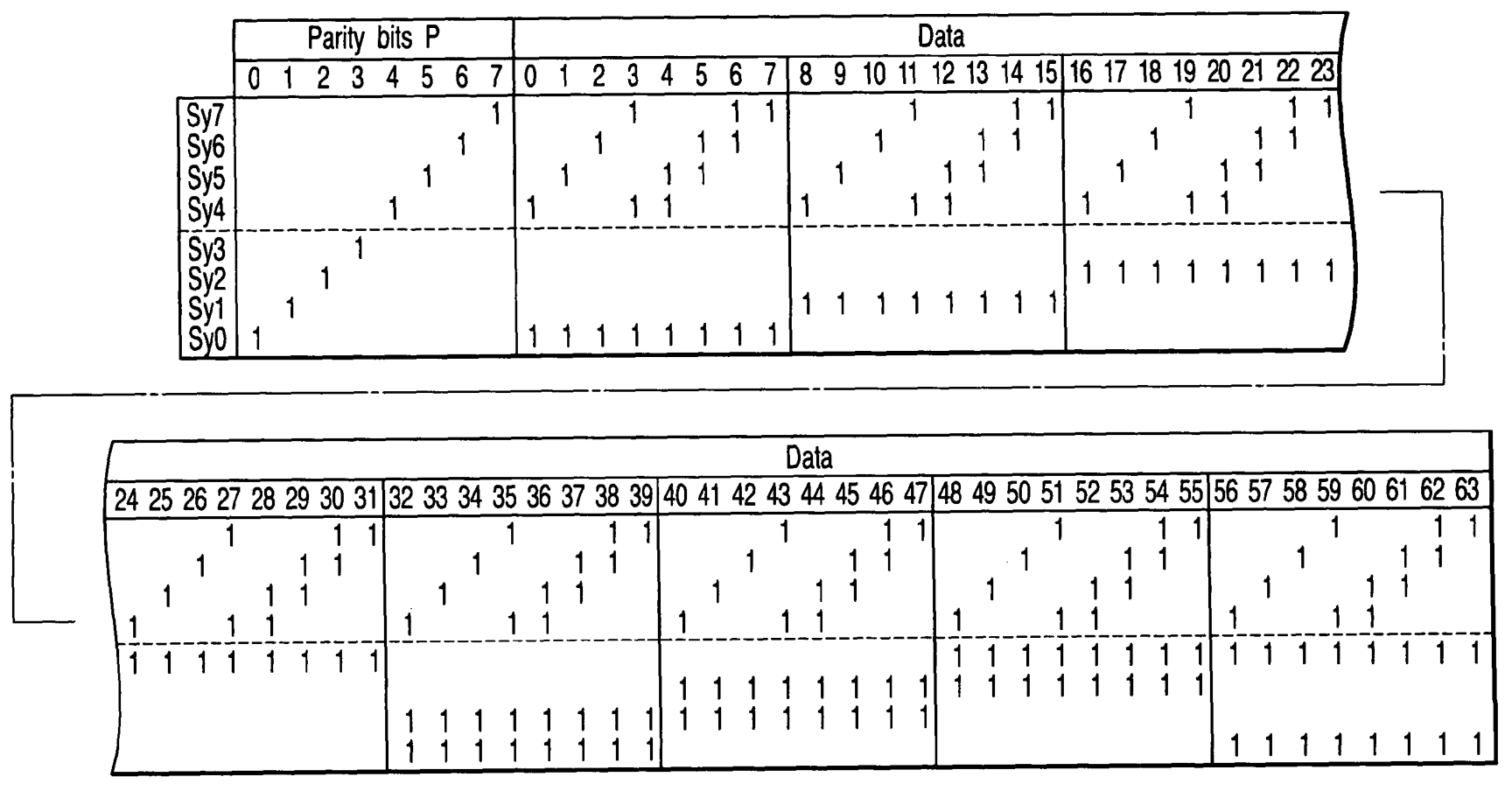

FIG. 6 is a view illustrating a check code for use in the parity generation circuit 17 and syndrome generation circuit 15. In FIG. 6, to make it easy to understand the feature of the check code, only bits "1" are shown. Actually, however, the check code is formed of bits "0" and "1".

The check code (this is also called a check matrix) is formed of 8 rows corresponding in number to the syndrome bits Sy0 to Sy7, and 72 columns corresponding in number to the sum of the parity bits P0 to P7 and read data bits RD0 to RD63. Numbers 0 to 7 attached to the 8 columns of the "parity bits P" shown in FIG. 6 correspond to the bit numbers of the parity bits P0 to P7. Further, numbers 0 to 63 attached to the 64 columns of the "data" shown in FIG. 6 correspond to the bit numbers of the read data bits RD0 to RD63.

The 64-bit data corresponding to the parity bits P0 to P7 of 8 bits in total is formed of 8 data blocks BLK0 to BLK7. Each data block BLK is formed of 8-bit data. Specifically, the data block BLK0 is formed of data bits 0 to 7, the data block BLK1 is formed of data bits 8 to 15, the data block BLK2 is formed of data bits 16 to 23, and the data block BLK3 is formed of data bits 24 to 31. Further, the data block BLK4 is formed of data bits 32 to 39, the data block BLK5 is formed of data bits 40 to 47, the data block BLK6 is formed of data bits 48 to 55, and the data block BLK7 is formed of data bits 56 to 63.

The arrangement of bits "1" included in the lower 4 bits of the data section of the check code, which correspond to the syndrome bits Sy0 to Sy3, is changed in units of 8 bits for the reason described below.

The number of input/output (I/O) terminals of the semiconductor memory device of the second embodiment is 16. Further, the minimum number of write data bits is 8. Namely, the semiconductor memory device can write input data bits DI0 to DI7 of 8 bits in total, and can write input data bits DI0 to DI15 of 16 bits in total. Further, the semiconductor memory device can separately write the upper byte (input data bits DI8 to DI15 of 8 bits in total) of the input data bits DI0 to DI15 of 16 bits in total, and the lower byte (input data bits DI0 to DI7 of 8 bits in total). The arrangement of bits "1" included in the lower 4 bits of the data section is changed in units of 8 bits equal in number to the minimum write data bits.

Thus, since the arrangement of bits "1" included in the lower 4 bits of the data section of the check code shown in FIG. 6 is changed in units of 8 bits, the check code is useful for the detection of an erroneous bit performed in units of 8 bits. Namely, to determine whether each data block contains an erroneous bit, it is sufficient if 4-bit data (syndrome bits Sy0 to Sy3) is used.

The address control circuit 13 generates block selection signals BSL0 to BSL7. When, for example, the input data bits DI0 to DI15 of 16 bits in total are supplied from an external circuit, the block selection signals BSL0 to BSL7 are used to indicate which one of the blocks that are formed of the write data bits WE0 to WD63 of 64 bits in total and needed to be rewritten to write the input data bits DI0 to DI15 corresponds to the input data bits DI0 to DI15.

When the write enable signal WE is at low level (when data is written to the semiconductor memory device), the address control circuit 13 outputs the block selection signals BSL0 to BSL7 to the error detection circuit 19.

The error detection circuit 19 determines whether each of the data blocks BLK0 to BLK7 is erroneous, using the syndrome bits Sy0 to Sy3 as the lower 4 bits of the syndrome bits Sy0 to Sy7, and generates a block error signal BE indicating the determination result.

Figure 7:
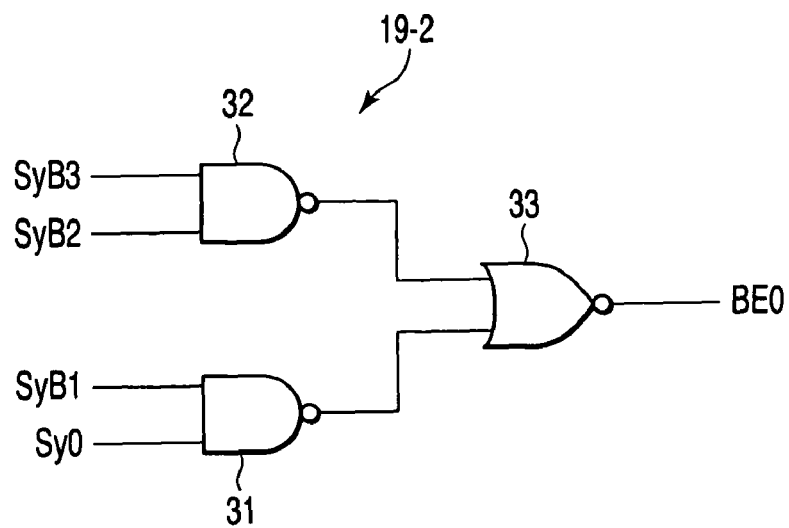
FIG. 7 is a circuit diagram illustrating part (detection circuit 19-2) of an error detection circuit 19 according to the second embodiment.

The operation of detecting an erroneous bit in block 0 (including read data bits RD0 to RD7) will be described as an example. FIG. 7 is a circuit diagram illustrating a detection circuit 19-2 incorporated in the error detection circuit 19 for detecting an error in block 0.

The detection circuit 19-2 comprises two NAND circuits 31 and 32 and NOR circuit 33. The NAND circuit 31 receives a syndrome bit Sy0 and inverse syndrome bit SyB1. The NAND circuit 32 receives inverse syndrome bits SyB2 and SyB3.

The outputs of the two NAND circuits 31 and 32 are connected to the NOR circuit 33. When a block error signal BE0 as the output of the NOR circuit 33 indicates data "1", it is determined that block 0 included in the data bits RD0 to RD63 contains an erroneous bit. In contrast, when the block error signal BE0 indicates data "0", it is determined that block 0 contains no erroneous bit. The block error signal BE is input to the parity correction circuit 18. Further, the error detection circuit 19 generates an inverse block error signal BEB as the inverse signal of the block error signal BE. The inverse block error signal BEB is also input to the parity correction circuit 18.

The parity correction circuit 18 includes a correction determination circuit 18A. The correction determination circuit 18A determines whether it is necessary to correct the parity bits P, based on the inverse block error signal BEB and block selection signal BSL. Even when an erroneous bit is included in the read data bits RD0 to RD63, if a block including the erroneous bit is replaced with input data, it is not necessary to correct a parity bit corresponding to the block.

Figure 8:
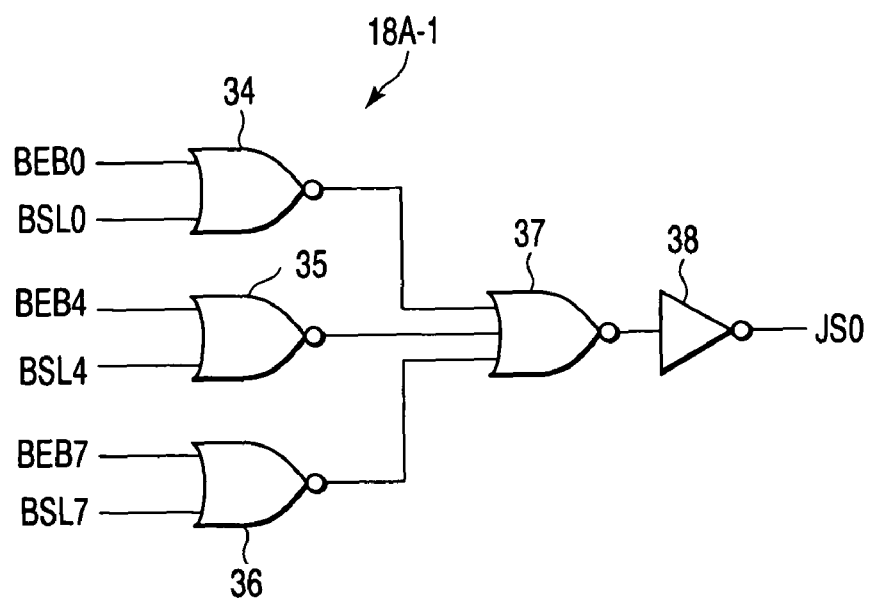
FIG. 8 is a circuit diagram illustrating part (determination circuit 18A-1) of a correction determination circuit 18A according to the second embodiment.

The operation of determining whether the parity bit P0 should be corrected will be described as an example. FIG. 8 is a circuit diagram illustrating a determination circuit 18A-1 incorporated in the correction determination circuit 18A for determining whether the parity bit P0 should be corrected.

The determination circuit 18A-1 comprises 4 NOR circuits 34 to 37 and inverter circuit 38. The NOR circuit 34 receives an inverse block error signal BEB0 and block selection signal BSL0. The NOR circuit 35 receives an inverse block error signal BEB4 and block selection signal BSL4. The NOR circuit 36 receives an inverse block error signal BEB7 and block selection signal BSL7.

The outputs of the NOR circuits 34 to 36 are connected to the NOR circuit 37. The output of the NOR circuit 37 is connected to the inverter circuit 38. If a determination signal JS0 as the output of the inverter circuit 38 indicates data "1", it is determined that the parity bit P0 should be corrected. In contrast, if the determination signal JS0 indicates data "0", it is determined unnecessary to correct the parity bit P0.

Based on the determination signal JS0, the parity correction circuit 18 corrects the parity bits P0 to P7. The corrected parity bits P0 to P7 are stored in the second area of the memory cell array 11.

As described above in detail, the second embodiment can determine at high speed whether read data bits with addresses other than those of the input data bits contain an erroneous bit. This can reduce the number of computations by the error detection circuit 19.

Third Embodiment

A third embodiment is directed to a structure in which part of the syndrome generation circuit 15 and parity generation circuit 17 is used in common.

Figure 9:
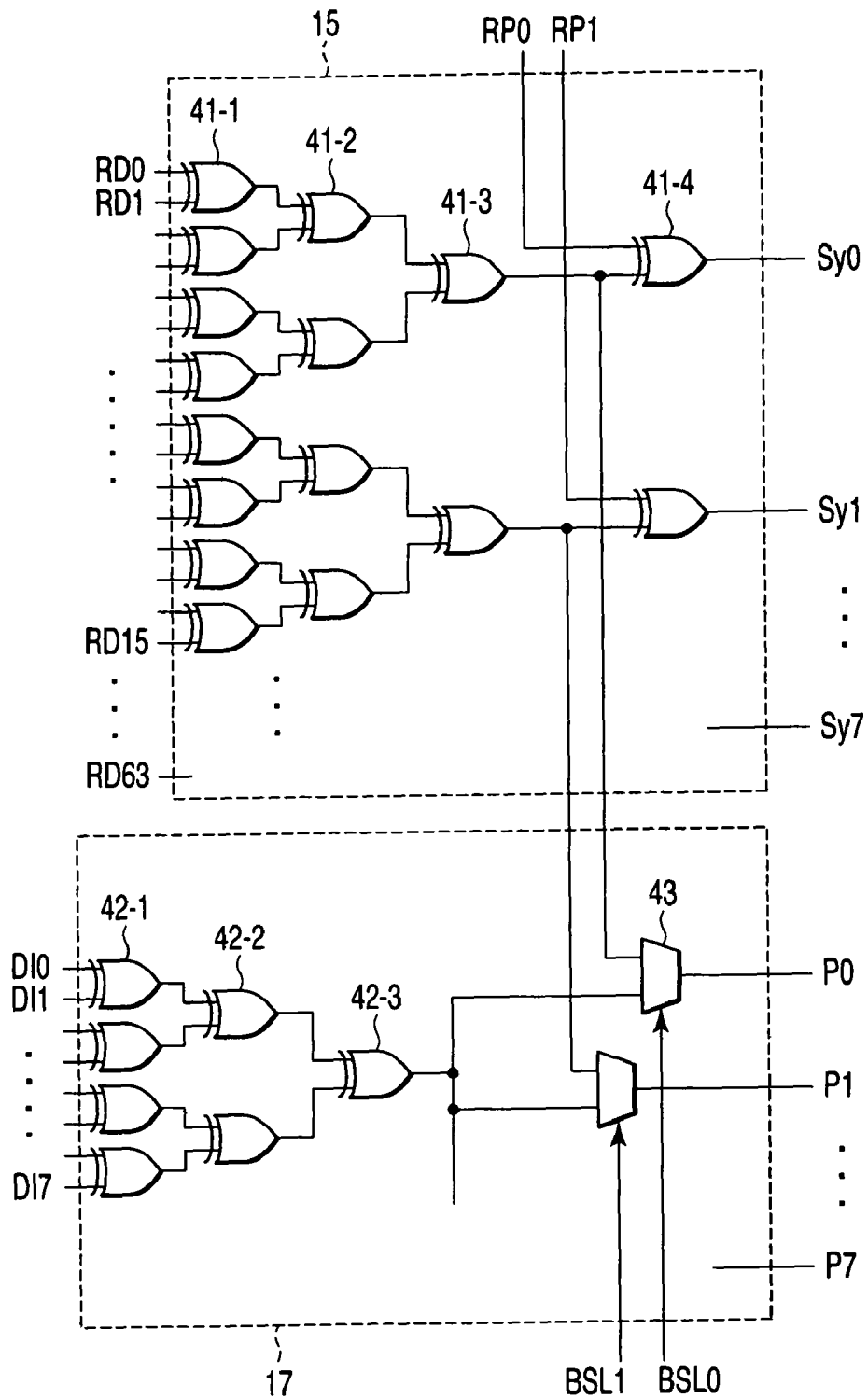
FIG. 9 is a circuit diagram illustrating the essential part of a semiconductor memory device according to a third embodiment.

FIG. 9 is a circuit diagram illustrating the essential part of a semiconductor memory device according to the third embodiment. In this embodiment, data bits DI0 to DI7 of 8 bits in total are input, for example.

The syndrome generation circuit 15 comprises 32 two-input exclusive-OR circuits (hereinafter referred to as "XOR circuits") 41-1 of the first stage, 16 XOR circuits 41-2 of the second stage, 8 XOR circuits 41-3 of the third stage, and 8 XOR circuits 41-4 of the fourth stage.

The first- to fourth-stage XOR circuits are connected by cascade connection. More specifically, the output terminals of the XOR circuits 41-1 of the first stage are connected to the input terminals of the XOR circuits 41-2 of the second stage. The output terminals of the XOR circuits 41-2 of the second stage are connected to the input terminals of the XOR circuits 41-3 of the third stage. The output terminal of each of the XOR circuits 41-3 of the third stage is connected to one of the input terminals of the corresponding one of the XOR circuits 41-4 of the fourth stage.

Read data bits RD0 to RD63 are input to the input terminals of the XOR circuits 41-1 of the first stage. Read parity bits RP0 to RP7 are input to the other input terminals of the XOR circuits 41-4 of the fourth stage. Syndrome bits Sy0 to Sy7 are output from the output terminals of the XOR circuits 41-4 of the fourth stage.

The parity generation circuit 17 comprises four XOR circuits 42-1 of the first stage, two XOR circuits 42-2 of the second stage and one XOR circuit 42-3 of the third stage.

The XOR circuits 42-1, 42-2 and 42-3 of the first to third stages are connected by cascade connection. More specifically, the output terminals of the XOR circuits 42-1 of the first stage are connected to the input terminals of the XOR circuits 42-2 of the second stage. The output terminals of the XOR circuits 42-2 of the second stage are connected to the input terminals of the XOR circuits 42-3 of the third stage. Input data bits DI0 to DI17 are input to the input terminals of the XOR circuits 42-1 of the first stage.

Further, the parity generation circuit 17 includes eight selection circuits (multiplexers) 43. The output terminal of the XOR circuit 42-3 is connected to one of the input terminals of each of the selection circuits 43. The output terminals of the XOR circuits 41-3 are connected to the other input terminals of the selection circuits 43. The block selection signals BSL0 to BSL7 are input to the respective control terminals of the selection circuits 43. Parity bits P0 to P7 are output from the selection circuits 43.

In the semiconductor memory device constructed as the above, read parity bits RP0 to RP7 input to the syndrome generation circuit 15 are input to the respective XOR circuits 41-4 of the final (fourth) stage. In the syndrome computation process by the syndrome generation circuit 15, the XOR circuits of the first to third stages included in the circuit 15 perform computation only using the read data bits RD0 to RD63.

On the other hand, the parity generation circuit 17 computes parity bits, using data acquired by replacing part of the read data bits RD0 to RD63 with the input data bits DI0 to DI7. Accordingly, if, in the syndrome computation process, the read parity bits RP0 to RP7 are computed by the fourth-stage XOR circuits 41-4 of the syndrome generation circuit 15, the circuit part for computing the same read data can be used in common between the syndrome generation circuit 15 and parity generation circuit 17.

The selection circuits 43 each select one of the outputs of the corresponding XOR circuits 41-3 and 42-3, based on the block selection signals BSL0 to BSL7.

As described above in detail, in the third embodiment, part of the syndrome generation circuit 15 and parity generation circuit 17 can be used in common. This enables the chip size to be reduced.

Furthermore, since the computation by the parity generation circuit 17 using read data can be omitted, the number of computations performed in the semiconductor memory device can be reduced, and hence the speed of the entire computation can be increased.

The numbers of the bits of the above-mentioned various types of data (input data DI, read data RD, write data WD, parity bits P, syndrome bits Sy, etc.) are not limited to the specified ones. It is a matter of course that they can be set to any voluntary values in accordance with, for example, the system to which the present invention applied.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
    a memory cell array including a plurality of memory cells, and having a first area and a second area, the first area storing data, the second area storing a parity bit for error checking;
    a parity generation circuit which generates a parity bit with respect to first data including input data from an external source and a part of read data from the first area, each of the first data and the read data having a first number of data bits, the input data having a second number of data bits smaller than the first number of data bits;
    a syndrome generation circuit which generates a syndrome bit for correcting an error in the read data, based on the read data and the parity bit from the second area;
    a parity correction circuit which corrects the parity bit generated by the parity generation circuit, based upon the syndrome bit; and
    a data correction circuit which corrects the error included in the read data, based upon the syndrome bit, and forms corrected data,
    wherein a corrected parity bit and the corrected data are stored in the first area and the second area, respectively.

2. The semiconductor memory device according to claim 1, wherein the parity generation circuit executes parity generation processing in parallel with syndrome generation processing by the syndrome generation circuit.

3. The semiconductor memory device according to claim 1, further comprising:
    a data control circuit which writes, to the first area of the memory cell array, write data including the input data and a part of the corrected data, the write data having the first number of data bits.

4. The semiconductor memory device according to claim 1, wherein:
    the read data is classified into a plurality of data blocks;
    the parity generation circuit generates the parity bits corresponding to the data blocks; and
    the syndrome generation circuit generates the syndrome bits corresponding to the data blocks.

5. The semiconductor memory device according to claim 4, wherein the parity correction circuit corrects one of the parity bits corresponding to one of the data blocks which contains the error.

6. The semiconductor memory device according to claim 5, further comprising:
    a detection circuit which detects, based on the syndrome bits, the one of the data blocks which contains the error, and generates a detection signal,
    wherein the parity correction circuit corrects the parity bits generated by the parity generation circuit, based on the detection signal.

7. The semiconductor memory device according to claim 6, wherein the parity correction circuit corrects the parity bits when part of the read data contains the error.

8. The semiconductor memory device according to claim 7, further comprising:
    an address control circuit which generates a block selection signal indicating one of the data blocks of the read data corresponding to the input data,
    wherein the parity correction circuit includes a determination circuit which determines whether the part of the read data includes the error, based on the block selection signal.

9. The semiconductor memory device according to claim 8, wherein the address control circuit generates the block selection signal when a write enable signal for controlling data writing is activated.

10. The semiconductor memory device according to claim 4, wherein the parity generation circuit and the syndrome generation circuit generate the parity bits and the syndrome bits, using a check code.

11. The semiconductor memory device according to claim 10, wherein the check code has a cycle.

12. The semiconductor memory device according to claim 11, wherein the cycle corresponds to a minimum number of bits of data which can be simultaneously written to the memory cell array.

13. The semiconductor memory device according to claim 11, wherein the cycle corresponds to a number of bits of each of the data blocks.

14. The semiconductor memory device according to claim 11, wherein the check code includes a plurality of bits arranged in rows and columns, number of rows corresponding to number of the syndrome bits, number of columns corresponding to total number of the read data bits and the parity bits.

15. The semiconductor memory device according to claim 10, wherein the check code is a hamming code.

16. The semiconductor memory device according to claim 1, wherein the parity generation circuit generates the parity bit using a computation result of the syndrome generation circuit.

17. The semiconductor memory device according to claim 16, wherein:

the syndrome generation circuit executes computation using the parity bit after computation using the read data; and the parity generation circuit executes parity generation processing using a result of the computation executed by the syndrome generation circuit using the read data.

18. The semiconductor memory device according to claim 1, wherein each of the memory cells includes a ferroelectric capacitor and a transistor connected in series to the ferroelectric capacitor.

* * * * *